(12) United States Patent
Qin

(10) Patent No.: US 11,094,913 B1
(45) Date of Patent: Aug. 17, 2021

(54) FLEXIBLE ORGANIC LIGHT EMITTING DIODE (OLED) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Xuesi Qin, Wuhan (CN)

( * ) Notice: Subject to any disclaimer, the term of this patent is extended or adjusted under 35 U.S.C. 154(b) by 514 days.

(21) Appl. No.: 16/306,590

(22) PCT Filed: Aug. 24, 2018

(86) PCT No.: PCT/CN2018/102273
§ 371 (c)(1),
(2) Date: Dec. 3, 2018

(87) PCT Pub. No.: WO2019/205385
PCT Pub. Date: Oct. 31, 2019

(30) Foreign Application Priority Data

Apr. 27, 2018 (CN) .......................... 201810389127.5

(51) Int. Cl.
*H01L 51/00* (2006.01)
*H01L 51/52* (2006.01)

(52) U.S. Cl.
CPC ........ *H01L 51/5253* (2013.01); *H01L 51/529* (2013.01); *H01L 51/5246* (2013.01); *H01L 51/5293* (2013.01); *H01L 51/0097* (2013.01); *H01L 2251/5338* (2013.01)

(58) Field of Classification Search
CPC ............. H01L 51/5253; H01L 51/5246; H01L 51/529; H01L 51/5293; H01L 51/0097; H01L 2251/5338
See application file for complete search history.

(56) References Cited

U.S. PATENT DOCUMENTS

| | | | |
|---|---|---|---|
| 7,265,444 B2 * | 9/2007 | Koike | H01L 27/14806 257/706 |
| 8,729,794 B2 * | 5/2014 | Hasegawa | H01L 51/5218 313/505 |
| 9,466,748 B2 * | 10/2016 | Linderman | H01L 31/0508 |
| 9,773,450 B2 * | 9/2017 | Takahara | G09G 3/3266 |
| 10,714,525 B2 * | 7/2020 | Yee | H01L 27/14683 |
| 2014/0246665 A1 | 9/2014 | Lang et al. | |

FOREIGN PATENT DOCUMENTS

| | | |
|---|---|---|
| CN | 103875090 A | 6/2014 |
| CN | 104091890 A | 10/2014 |
| CN | 106206988 A | 12/2016 |
| CN | 107819024 A | 3/2018 |

* cited by examiner

*Primary Examiner* — Ida M Soward

(57) ABSTRACT

A flexible organic light emitting diode (OLED) display panel is provided, including: a flexible base and an organic light emitting layer, a thin film encapsulating layer, a polarizer, a glass cover, and a sealing, heat-dissipation glue sequentially formed on the flexible base. The sealing, heat-dissipation glue is formed on sidewalls of the OLED display panel to prevent moisture from entering into the OLED display panel. The sealing, heat-dissipation glue includes heat absorbing particles; the heat absorbing particles are configured for absorbing heat generated by the OLED display panel.

18 Claims, 2 Drawing Sheets

FLEXIBLE ORGANIC LIGHT EMITTING DIODE (OLED) DISPLAY PANEL

CROSS REFERENCE TO RELATED APPLICATION

This application claims the priority of International Application No. PCT/CN2018/102273 filed on 2018 Aug. 24, which claims priority to Chinese Application No. 201810389127.5, filed on 2018 Apr. 27. The entire disclosures of each of the above applications are incorporated herein by reference.

BACKGROUND OF THE INVENTION

Field of Invention

The present invention relates to displays, and particularly to a flexible organic light emitting diode (OLED) display panel.

Description of Prior Art

Flexible OLED displays are gradually gaining attention and are widely recognized as next-generation, mainstream displays. However, the OLED panels still have obvious defects, such as a much shorter life span than LCD displays, which seriously affects applications of OLED panels. As the OLED displays are used as a new type of display devices, luminous efficiency is a key parameter to evaluate a performance of the displays. Luminous efficiency has been hoped to increase for the OLED display to be produced. However, with the improvement of luminous efficiency and the poor power management of the OLED displays, the OLED panel displays generate more heat, which is a challenge for the life span of the OLED panels.

FIG. 1 is a schematic diagram of illuminating principle of an OLED panel. Electrons and holes in an OLED light-emitting layer 102 are combined to generate excitons, and when the excitons return to a steady state, photons are released, meanwhile heat is also generated and released. Therefore, heat is generated and light is emitted by the OLED devices, and the heat is released through other layers, wherein the heat is released as indicated by arrows in the figure. In addition, for a flexible OLED panel, a thin film encapsulating layer 103 is formed on the light emitting layer 102; the thin film encapsulating layer 103 is an organic layer having a certain heat insulation effect, and a TFT substrate 101 formed under the light emitting layer 102 also generates heat, whereby heat dissipation is not smooth. In addition, sealants are formed on edges of the OLED panels, and the sealants affect the heat dissipation from edges of the OLED panel, whereby the life span of the OLED panel is decreased.

Therefore, it is necessary to provide a flexible OLED display panel to solve the problems in the prior art.

SUMMARY OF THE INVENTION

The application mainly provides a flexible OLED display panel to improve heat dispersions and to increase the life span of the OLED panel.

For the above-mentioned objective, the present disclosure employs the following technical schemes.

The present disclosure provides a flexible OLED display panel, which includes:
a flexible base;
an organic light emitting layer formed on the flexible base;
a thin film encapsulating layer formed on the organic light emitting layer;
a polarizer formed on the thin film encapsulating layer;
a glass cover formed on the polarizer; and
a sealing, heat-dissipation glue formed on sidewalls of the OLED display panel configured for preventing moisture from entering into the OLED display panel; and
wherein the sealing, heat-dissipation glue includes a plurality of heat absorbing particles, the heat absorbing particles are configured for absorbing heat generated from the OLED display panel, the sealing, heat-dissipation glue includes a plurality of sealing, heat-dissipation glue layers arranged outwardly from theسidewalls of the OLED display panel, a concentration of the heat absorbing particles in each of the plurality of sealing, heat-dissipation glue layers is different, and numbers of the heat absorbing particles in each of the plurality of sealing, heat-dissipation glue layers are gradually increased along an outward direction from the sidewalls of the OLED display panel.

In one exemplary embodiment of the flexible OLED display panel, the heat absorbing particles include silicone grease particles.

In one exemplary embodiment of the flexible OLED display panel, the sealing, heat-dissipation glue covers sidewalls of the flexible base, the organic light emitting layer, the thin film encapsulating layer, and the polarizer.

In one exemplary embodiment of the flexible OLED display panel, the sealing, heat-dissipation glue extends at least to an edge region of a back surface of the flexible base.

In one exemplary embodiment of the flexible OLED display panel, the sealing, heat-dissipation glue extends at least to an edge region of a surface of the polarizer secured to the glass cover.

In one exemplary embodiment of the flexible OLED display panel, the flexible base includes a display region and a non-display region, a flexible printed circuit board is formed on an edge area of the non-display region of the flexible base, the sealing, heat-dissipation glue extends to a surface of the flexible printed circuit board along the sidewall of the flexible base for preventing moisture from entering into a bonding area of the flexible printed circuit board.

In one exemplary embodiment of the flexible OLED display panel, the glass cover covers the sealing, heat-dissipation glue formed on an edge of the display region.

In one exemplary embodiment of the flexible OLED display panel, the sealing, heat-dissipation glue includes an ultraviolet (UV) glue and the silicone grease particles distributed in the UV glue, wherein the silicone grease particles distributed in the sealing, heat-dissipation glue layer are evenly distributed at a preset concentration.

In one exemplary embodiment of the flexible OLED display panel, the UV glue is made of one or more of polyacrylates, polyvinyl alcohols, and vinyl acetate copolymers.

The present disclosure provides a flexible OLED display panel, includes:
a flexible base;
an organic light emitting layer formed on the flexible base;
a thin film encapsulating layer formed on the organic light emitting layer;
a polarizer formed on the thin film encapsulating layer;
a glass cover formed on the polarizer; and a sealing, heat-dissipation glue formed on sidewalls of the OLED display panel configured for preventing moisture from entering into the OLED display panel; and wherein the sealing, heat-dissipation glue includes a plurality of heat absorbing particles, the heat absorbing particles are configured for absorbing heat generated from the OLED display panel, the sealing, heat-dissipation glue includes a plurality of sealing, heat-dissipation glue layers arranged outwardly from the sidewalls of the OLED display panel, a concentration of the heat absorbing particles in each of the plurality of sealing, heat-dissipation glue layers is different.

In one exemplary embodiment of the flexible OLED display panel, the heat absorbing particles include silicone grease particles.

In one exemplary embodiment of the flexible OLED display panel, the sealing, heat-dissipation glue covers sidewalls of the flexible base, the organic light emitting layer, the thin film encapsulating layer, and the polarizer.

In one exemplary embodiment of the flexible OLED display panel, the sealing, heat-dissipation glue extends at least to an edge region of a back surface of the flexible base.

In one exemplary embodiment of the flexible OLED display panel, the sealing, heat-dissipation glue extends at least to an edge region of a surface of the polarizer secured to the glass cover.

In one exemplary embodiment of the flexible OLED display panel, the flexible base includes a display region and a non-display region, a flexible printed circuit board is formed on an edge area of the non-display region of the flexible base, the sealing, heat-dissipation glue extends to a surface of the flexible printed circuit board along the sidewall of the flexible base for preventing moisture from entering into a bonding area of the flexible printed circuit board.

In one exemplary embodiment of the flexible OLED display panel, the glass cover covers the sealing, heat-dissipation glue formed on an edge of the display region.

In one exemplary embodiment of the flexible OLED display panel, the sealing, heat-dissipation glue includes an ultraviolet (UV) glue and the silicone grease particles distributed in the UV glue, wherein the silicone grease particles distributed in the sealing, heat-dissipation glue layer are evenly distributed at a preset concentration.

In one exemplary embodiment of the flexible OLED display panel, the UV glue is made of one or more of polyacrylates, polyvinyl alcohols, and vinyl acetate copolymers.

The beneficial effect of this invention is: in the flexible OLED display panel of the application, a UV glue is formed on sidewalls of the OLED display panel to prevent moisture from entering into the OLED display panel and to increase the lifetime of the OLED display panel. For solving a poor performance of heat dispersions of the UV glue, the application provides an improvement of the UV glue formed by a multilayered, gluing process, a plurality of silicone grease particles with excellent thermal conductivity is distributed in the UV glue, numbers of the heat absorbing particles in each of the plurality of layers of the sealant are gradually increased along an outward direction from the sidewalls of the OLED display panel to improve the heat dispersion. The sealant includes a sealing glue layer as a base layer made of epoxy insulation and silicon lipid for ensuring sealing and forming a heat-dissipation layer. Thus, performance of heat absorptions and heat dissipations of the OLED display panel is improved, thereby increasing the lifetime of the OLED display panel.

BRIEF DESCRIPTION OF THE DRAWINGS

In order to describe clearly the embodiment in the present disclosure or the prior art, the following will introduce the drawings for the embodiment shortly. Obviously, the following description is only a few embodiments, for the common technical personnel in the field it is easy to acquire some other drawings without creative work.

DETAILED DESCRIPTION OF THE PREFERRED EMBODIMENTS

Figure 1:
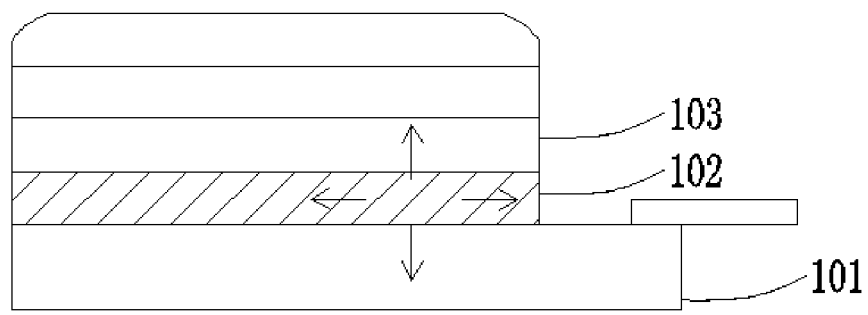
FIG. 1 is a schematic diagram of illuminating principle of an OLED panel in the prior art.

The description of following embodiment, with reference to the accompanying drawings, is used to exemplify specific embodiments which may be carried out in the present disclosure. Directional terms mentioned in the present disclosure, such as "top", "bottom", "front", "back", "left", "right", "inside", "outside", "side", etc., are only used with reference to the orientation of the accompanying drawings. Therefore, the used directional terms are intended to illustrate, but not to limit, the present disclosure. In the drawings, the components having similar structures are denoted by same numerals.

The application solves technical problems that a short life span of an OLED panels is caused by a poor performance of heat dispersions of a flexible OLED display panel of the prior art.

Figure 2:
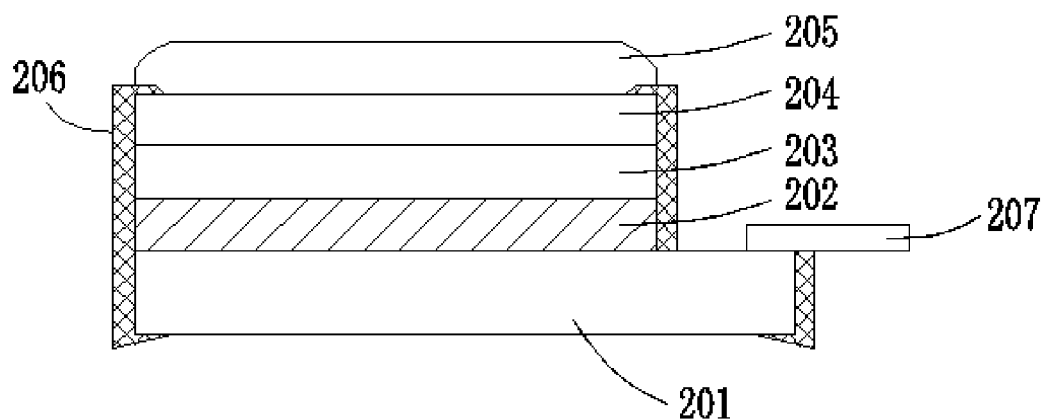
FIG. 2 is a structure diagram of a flexible OLED display panel according to one exemplary embodiment of the present disclosure.

Referring to FIG. 2, FIG. 2 is a structure diagram of a flexible OLED display panel according to one exemplary embodiment of the present disclosure. The flexible OLED display panel includes: a flexible base 201, a thin film transistor layer formed on the flexible base 201, an organic light emitting layer 202 formed on the flexible base 201, a thin film encapsulating layer 203 formed on the organic light emitting layer 202, a polarizer 204 formed on the thin film encapsulating layer 203, a glass cover 205 formed on the polarizer 204, and a sealing, heat-dissipation glue 206, formed on sidewalls of the OLED display panel. The sealing, heat-dissipation glue 206 is configured for preventing moisture from entering into the OLED display panel. The flexible base 201 includes a display region and a non-display region. A flexible printed circuit board 207 is formed on an edge area of the non-display region of the flexible base 201.

The sealing, heat-dissipation glue 206 covers sidewalls of the flexible base 201, the organic light emitting layer 202, the thin film encapsulating layer 203, and the polarizer 204. In at least one embodiment, the sealing, heat-dissipation glue 206 extends at least to an edge region of a back surface of the flexible base 201. In at least one embodiment, the sealing, heat-dissipation glue 206 extends at least to an edge region of a surface of the polarizer 204 secured to the glass cover 205 to prevent moisture from entering into the OLED display panel via an edge of the sealing, heat-dissipation glue 206 when it is damaged or insecurely adhered to the sidewalls of the flexible base 201.

On a sidewall of the flexible base 201 bonding with the flexible printed circuit board 207, the sealing, heat-dissipation glue 206 extends along the sidewall of the flexible base 201 to a surface of the flexible printed circuit board 207 to seal the a bonding area of the flexible printed circuit board 207 and the flexible printed circuit board 207 and to prevent moisture from entering into the bonding area. In at least one embodiment, the glass cover 205 covers the sealing, heat-dissipation glue 206 formed on an edge area of the display region to protect the sealing, heat-dissipation glue 206 from damage.

The sealing, heat-dissipation glue 206 includes a plurality of heat absorbing particles. The heat absorbing particles are configured for absorbing heat generated by the OLED display panel. Heat is generated and light is emitted by the organic light emitting layer 202, and heat is generated by components of the flexible base 201 in a working state, and the majority of heat is released through other layers. The sealing, heat-dissipation glue 206 of the application is formed on the sidewalls of the OLED display panel to be used as a sealant to prevent moisture from entering into the OLED display panel, to be used as a heat-dissipation glue to absorb heat generated by the OLED display panel from a center to the sidewalls to make heat to be absorbed and make heat to be released, and to thereby increase the life span of the OLED display panel. The heat absorbing particles include silicone grease particles with a good performance of heat dissipation, and other heat absorption materials can be used without being limited.

Figure 3:
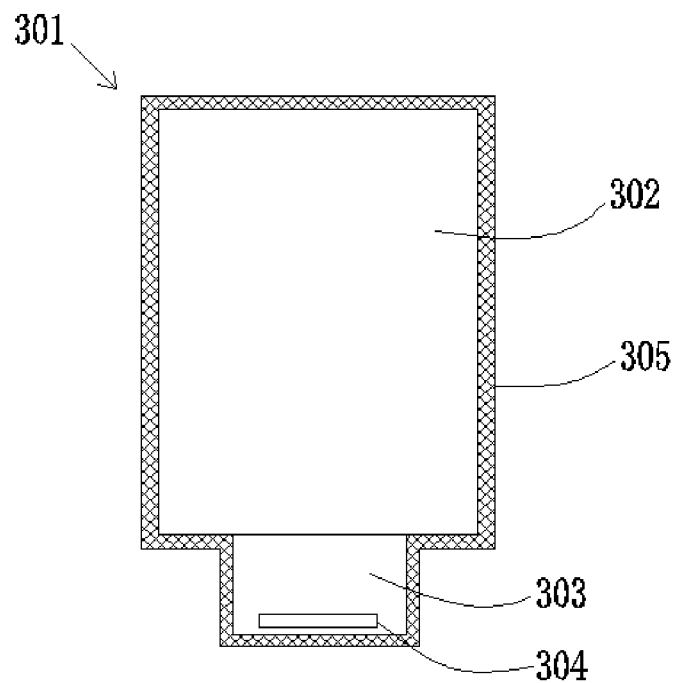
FIG. 3 is a top view of a flexible OLED display panel according to one exemplary embodiment of the present disclosure.

FIG. 3 shows a top view of the OLED display panel. The display panel 301 includes a display region 302 and a non-display region 303. An outer lead bonding (OLB) region 304 is defined in the non-display region 303 of the display panel 301. A sealing, heat-dissipation glue 305 is formed on edges of the display panel 301 and adhered to the sidewalls of the display panel 301. The sealing, heat-dissipation glue 305 can prevent moisture from entering into the display panel 301 and absorb heat generated by the display panel 301 to make the display panel 301 have a good performance of heat absorption.

Figure 4:
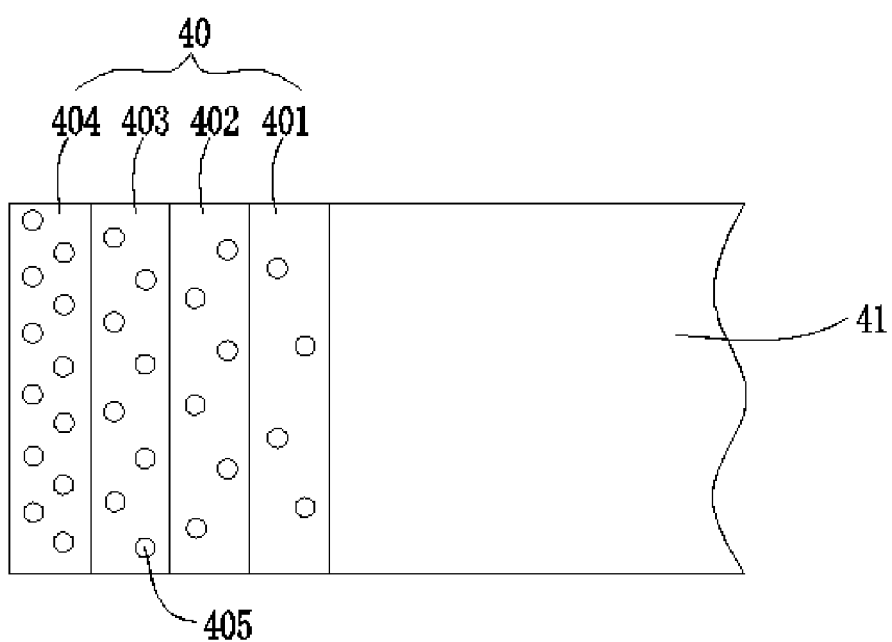
FIG. 4 is a structure diagram of a sealing, heat-dissipation glue film layer of a flexible OLED display panel according to one exemplary embodiment of the present disclosure.

Referring to FIG. 4, FIG. 4 is a structure diagram of a sealing, heat-dissipation glue film layer of a flexible OLED display panel according to one exemplary embodiment of the present disclosure. The sealing, heat-dissipation glue 40 is adhered on sidewalls of the OLED display panel 41. The sealing, heat-dissipation glue 40 includes a plurality of sealing, heat-dissipation glue layers arranged outwardly from the sidewalls of the OLED display panel, and four layers are shown in the figure, but the number of the layers is not limited and can be more than four; the four-layered structure is an exemplary embodiment for illustration. The sealing, heat-dissipation glue 40 includes a first sealing, heat-dissipation glue layer 401, a second sealing, heat-dissipation glue layer 402, a third sealing, heat-dissipation glue layer 403 and a fourth sealing, heat-dissipation glue layer 404 sequentially arranged outwardly from the sidewalls of the OLED display panel. A plurality of silicone grease particles 405 distributed in each of the sealing, heat-dissipation glue layer are evenly distributed at a preset concentration. A concentration of the silicone grease particles 405 in each of the plurality of sealing, heat-dissipation glue layers is different.

In at least one embodiment, numbers of the silicone grease particles 405 distributed in each of the first sealing, heat-dissipation glue layer 401, the second sealing, heat-dissipation glue layer 402, the third sealing, heat-dissipation glue layer 403, and the fourth sealing, heat-dissipation glue layer 404 are gradually increased. Because the outermost layer has a great concentration of the heat absorbing particles and has a good performance of heat dissipation, and the heat is ceaselessly released from an inner side to an outside of the OLED display panel 41 for enabling the OLED display panel 41 to have a good performance of heat absorption and dissipation.

In at least one embodiment, the sealing, heat-dissipation glue 40 includes a UV glue. The silicone grease particles 405 are distributed in the UV glue. The UV glue is made of one or more of polyacrylates, polyvinyl alcohols, and vinyl acetate copolymers. The UV glue can be made of other materials.

Because the sealing, heat-dissipation glue 40 includes the UV glue with a high, water-absorbing capability and the silicone grease particles 405 distributed in different concentrations wherein the silicone grease particles 405 have a good performance of heat dissipation, a combination of the UV glue and the silicone grease particles 405 has a good performance of heat dissipation and a waterproof function.

In the flexible OLED display panel of the application, a UV glue is formed on sidewalls of the OLED display panel to prevent moisture from entering into the OLED display panel and to increase the lifetime of the OLED display panel. For solving a poor performance of heat dispersions of the UV glue, the application provides an improvement of the UV glue formed by a multilayered, gluing process, a plurality of silicone grease particles with excellent thermal conductivity is distributed in the UV glue, numbers of the heat absorbing particles in each of the plurality of layers of the sealant are gradually increased along an outward direction from the sidewalls of the OLED display panel to improve the heat dispersion. The sealant includes a sealing glue layer as a base layer made of epoxy insulation and silicon lipid for ensuring sealing and forming a heat-dissipation layer. Thus, performance of heat absorptions and heat dissipations of the OLED display panel is improved, thereby increasing the lifetime of the OLED display panel.

As is understood by persons skilled in the art, the foregoing preferred embodiments of the present disclosure are illustrative rather than limiting of the present disclosure. It is intended that they cover various modifications and that similar arrangements be included in the spirit and scope of the present disclosure, the scope of which should be accorded the broadest interpretation so as to encompass all such modifications and similar structures.

What is claimed is:

1. A flexible organic light emitting diode (OLED) display panel, comprising:
   a flexible base;
   an organic light emitting layer formed on the flexible base;
   a thin film encapsulating layer formed on the organic light emitting layer;
   a polarizer formed on the thin film encapsulating layer;
   a glass cover formed on the polarizer; and
   a sealing, heat-dissipation glue formed on sidewalls of the OLED display panel configured for preventing moisture from entering into the OLED display panel; and
   wherein the sealing, heat-dissipation glue comprises a plurality of heat absorbing particles, the heat absorbing particles are configured for absorbing heat generated from the OLED display panel, the sealing, heat-dissipation glue comprises a plurality of sealing, heat-dissipation glue layers arranged outwardly from the sidewalls of the OLED display panel, a concentration of the heat absorbing particles in each of the plurality of sealing, heat-dissipation glue layers is different, and numbers of the heat absorbing particles in each of the plurality of sealing, heat-dissipation glue layers are gradually increased along an outward direction from the sidewalls of the OLED display panel.

2. The flexible OLED display panel of claim 1, wherein the heat absorbing particles comprise silicone grease particles.

3. The flexible OLED display panel of claim 2, wherein the sealing, heat-dissipation glue comprises an ultraviolet (UV) glue and the silicone grease particles distributed in the UV glue, wherein the silicone grease particles distributed in the sealing, heat-dissipation glue layer are evenly distributed at a preset concentration.

4. The flexible OLED display panel of claim 3, wherein the UV glue is made of one or more of polyacrylates, polyvinyl alcohols, and vinyl acetate copolymers.

5. The flexible OLED display panel of claim 1, wherein the sealing, heat-dissipation glue covers sidewalls of the flexible base, the organic light emitting layer, the thin film encapsulating layer, and the polarizer.

6. The flexible OLED display panel of claim 1, wherein the sealing, heat-dissipation glue extends at least to an edge region of a back surface of the flexible base.

7. The flexible OLED display panel of claim 1, wherein the sealing, heat-dissipation glue extends at least to an edge region of a surface of the polarizer secured to the glass cover.

8. The flexible OLED display panel of claim 1, wherein the flexible base comprises a display region and a non-display region, a flexible printed circuit board is formed on an edge area of the non-display region of the flexible base, the sealing, heat-dissipation glue extends to a surface of the flexible printed circuit board along the sidewall of the flexible base for preventing moisture from entering into a bonding area of the flexible printed circuit board.

9. The flexible OLED display panel of claim 8, wherein the glass cover covers the sealing, heat-dissipation glue formed on an edge of the display region.

10. A flexible organic light emitting diode (OLED) display panel, comprising:
a flexible base;
an organic light emitting layer formed on the flexible base;
a thin film encapsulating layer formed on the organic light emitting layer;
a polarizer formed on the thin film encapsulating layer;
a glass cover formed on the polarizer; and
a sealing, heat-dissipation glue formed on sidewalls of the OLED display panel configured for preventing moisture from entering into the OLED display panel; and
wherein the sealing, heat-dissipation glue comprises a plurality of heat absorbing particles, the heat absorbing particles are configured for absorbing heat generated from the OLED display panel, the sealing, heat-dissipation glue comprises a plurality of sealing, heat-dissipation glue layers arranged outwardly from the sidewalls of the OLED display panel, a concentration of the heat absorbing particles in each of the plurality of sealing, heat-dissipation glue layers is different.

11. The flexible OLED display panel of claim 10, wherein the heat absorbing particles comprise silicone grease particles.

12. The flexible OLED display panel of claim 11, wherein the sealing, heat-dissipation glue comprises an ultraviolet (UV) glue and the silicone grease particles distributed in the UV glue, wherein the silicone grease particles distributed in the sealing, heat-dissipation glue layer are evenly distributed at a preset concentration.

13. The flexible OLED display panel of claim 12, wherein the UV glue is made of one or more of polyacrylates, polyvinyl alcohols, and vinyl acetate copolymers.

14. The flexible OLED display panel of claim 10, wherein the sealing, heat-dissipation glue covers sidewalls of the flexible base, the organic light emitting layer, the thin film encapsulating layer, and the polarizer.

15. The flexible OLED display panel of claim 10, wherein the sealing, heat-dissipation glue extends at least to an edge region of a back surface of the flexible base.

16. The flexible OLED display panel of claim 10, wherein the sealing, heat-dissipation glue extends at least to an edge region of a surface of the polarizer secured to the glass cover.

17. The flexible OLED display panel of claim 10, wherein the flexible base comprises a display region and a non-display region, a flexible printed circuit board is formed on an edge area of the non-display region of the flexible base, the sealing, heat-dissipation glue extends to a surface of the flexible printed circuit board along the sidewall of the flexible base for preventing moisture from entering into a bonding area of the flexible printed circuit board.

18. The flexible OLED display panel of claim 17, wherein the glass cover covers the sealing, heat-dissipation glue formed on an edge of the display region.

* * * * *